United States Patent
You et al.

(10) Patent No.: US 11,881,428 B2
(45) Date of Patent: Jan. 23, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Kang You, Hefei (CN); Jie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 155 days.

(21) Appl. No.: 17/449,687

(22) Filed: Oct. 1, 2021

(65) Prior Publication Data

US 2022/0216097 A1    Jul. 7, 2022

Related U.S. Application Data

(63) Continuation of application No. PCT/CN2021/104190, filed on Jul. 2, 2021.

(30) Foreign Application Priority Data

Jan. 5, 2021  (CN) .......................... 202110007944.1

(51) Int. Cl.
*H01L 21/762* (2006.01)
*H10B 12/00* (2023.01)
*H10B 41/42* (2023.01)

(52) U.S. Cl.
CPC ........ *H01L 21/76229* (2013.01); *H10B 12/09* (2023.02); *H10B 41/42* (2023.02)

(58) Field of Classification Search
CPC .. H01L 21/76224–76237; H10B 12/09; H10B 41/42–49
See application file for complete search history.

(56) References Cited

U.S. PATENT DOCUMENTS

| | | | |
|---|---|---|---|
| 7,947,551 B1 | 5/2011 | Syue | |
| 10,854,743 B2 | 12/2020 | Bian | |
| 11,069,559 B1* | 7/2021 | Chen | H01L 21/76229 |
| 2004/0032006 A1* | 2/2004 | Yun | H01L 21/76229 |
| | | | 438/258 |
| 2005/0020028 A1* | 1/2005 | Liao | H01L 21/76229 |
| | | | 257/E21.548 |
| 2006/0046426 A1* | 3/2006 | Sandhu | H01L 21/76229 |
| | | | 438/424 |

(Continued)

FOREIGN PATENT DOCUMENTS

| | | |
|---|---|---|
| CN | 1169208 C | 9/2004 |
| CN | 101930941 A | 12/2010 |

(Continued)

OTHER PUBLICATIONS

First Office Action of the Chinese application No. 202110007944.1, dated May 18, 2022.

*Primary Examiner* — Bryan R Junge

(74) *Attorney, Agent, or Firm* — Syncoda LLC; Feng Ma

(57) ABSTRACT

A semiconductor structure manufacturing method includes: a substrate is provided, and a trench structure is formed in the substrate; a first dielectric layer is formed in the trench structure, and a top surface of the first dielectric layer is lower than a top surface of the trench structure; and a protective layer is formed in the trench structure, and the protective layers at least covers a surface of the first dielectric layer and part of a side wall of the trench structure.

10 Claims, 16 Drawing Sheets

(56) References Cited

U.S. PATENT DOCUMENTS

| | | | |
|---|---|---|---|
| 2007/0026633 A1* | 2/2007 | Lee | H01L 21/76229 438/424 |
| 2007/0298585 A1* | 12/2007 | Lubomirsky | H01L 21/76229 257/E21.548 |
| 2009/0124061 A1* | 5/2009 | Kiyotoshi | H10B 69/00 257/E21.546 |
| 2009/0194810 A1* | 8/2009 | Kiyotoshi | H10B 41/41 257/E21.546 |
| 2012/0208346 A1* | 8/2012 | Kadoshima | H01L 21/76229 257/E21.546 |
| 2013/0193548 A1* | 8/2013 | Kim | H01L 21/70 257/E21.549 |
| 2013/0214338 A1* | 8/2013 | Mikasa | H01L 27/0629 257/296 |
| 2013/0241027 A1* | 9/2013 | Kwak | H01L 21/823431 257/506 |
| 2013/0249048 A1* | 9/2013 | Kim | H10B 12/09 257/E21.546 |
| 2014/0159193 A1 | 6/2014 | Kim et al. | |
| 2014/0252432 A1 | 9/2014 | Huang et al. | |
| 2015/0091127 A1* | 4/2015 | Lee | H10B 12/09 257/506 |
| 2015/0099342 A1 | 4/2015 | Tsai et al. | |
| 2015/0179259 A1* | 6/2015 | Kim | H01L 21/76229 711/125 |
| 2017/0012098 A1* | 1/2017 | Park | H10B 12/30 |
| 2018/0294264 A1* | 10/2018 | Han | H01L 27/092 |
| 2018/0361422 A1* | 12/2018 | Lee | H01L 21/76229 |
| 2019/0131186 A1* | 5/2019 | Chung | H01L 21/823821 |
| 2019/0198665 A1 | 6/2019 | Bian | |
| 2019/0214293 A1* | 7/2019 | Kim | H10B 12/053 |
| 2019/0378844 A1* | 12/2019 | Chen | H01L 21/76229 |
| 2020/0075397 A1* | 3/2020 | Chen | H01L 21/0228 |

FOREIGN PATENT DOCUMENTS

| | | |
|---|---|---|
| CN | 103377980 A | 10/2013 |
| CN | 103681311 A | 3/2014 |
| CN | 104157602 A | 11/2014 |
| CN | 104779195 A | 7/2015 |
| CN | 106229288 A | 12/2016 |
| CN | 107785426 A | 3/2018 |
| CN | 110518062 A | 11/2019 |
| CN | 110880472 A | 3/2020 |
| CN | 110970345 A | 4/2020 |
| CN | 111933566 A | 11/2020 |
| CN | 112838047 A | 5/2021 |
| KR | 1020070109483 A * | 11/2007 |
| KR | 1020090074536 A * | 7/2009 |
| KR | 1020130039067 A * | 4/2013 |

* cited by examiner

US 11,881,428 B2

SEMICONDUCTOR STRUCTURE AND MANUFACTURING METHOD THEREOF

CROSS-REFERENCE TO RELATED APPLICATIONS

This is a continuation of International Patent Application No. PCT/CN2021/104190 filed on Jul. 2, 2021, which claims priority to Chinese Patent Application No. 202110007944.1 filed on Jan. 5, 2021. The disclosures of the above-referenced applications are hereby incorporated by reference in their entirety.

BACKGROUND

With the rapid development of an integrated circuit manufacturing process, the requirement on the integration of a semiconductor product is becoming higher and higher. With the integration of the semiconductor product, sizes of semiconductor devices and sizes of isolation structures of the semiconductor devices are accordingly decreased, thereby resulting in increasing process complexities of isolation structures of semiconductor devices in semiconductor manufacturing processes.

SUMMARY

The present disclosure relates to the field of semiconductor manufacturing technologies, in particular to a semiconductor structure and a manufacturing method thereof.

According to some embodiments, a manufacturing method for a semiconductor structure and the semiconductor structure are provided.

A manufacturing method for a semiconductor structure, including:

A substrate is provided, and a trench structure is formed in the substrate.

A first dielectric layer is formed in the trench structure, and a top surface of the first dielectric layer is lower than a top surface of the trench structure.

A protective layer is formed in the trench structure, and the protective layer at least covers the surface of the first dielectric layer and part of side wall of the trench structure.

A semiconductor structure, including a substrate, a trench structure, a first dielectric layer and a protective layer. The trench structure is located in the substrate, the first dielectric layer covers the bottom and part of side wall of the trench structure, and the top surface of the first dielectric layer is lower than a top surface of the trench structure. The protective layer is located in the trench structure and at least covers the surface of the first dielectric layer and part of side wall of the trench structure.

BRIEF DESCRIPTION OF THE DRAWINGS

In order to describe and illustrate the embodiments and/or examples of the application better, references can be made to one or more drawings. However, appended details or examples for describing the drawings should not be considered as limits to the scope of the application of the disclosure and any one of presently described embodiments and/or examples and the best mode for presently understanding these applications.

DETAILED DESCRIPTION

Figure 1:
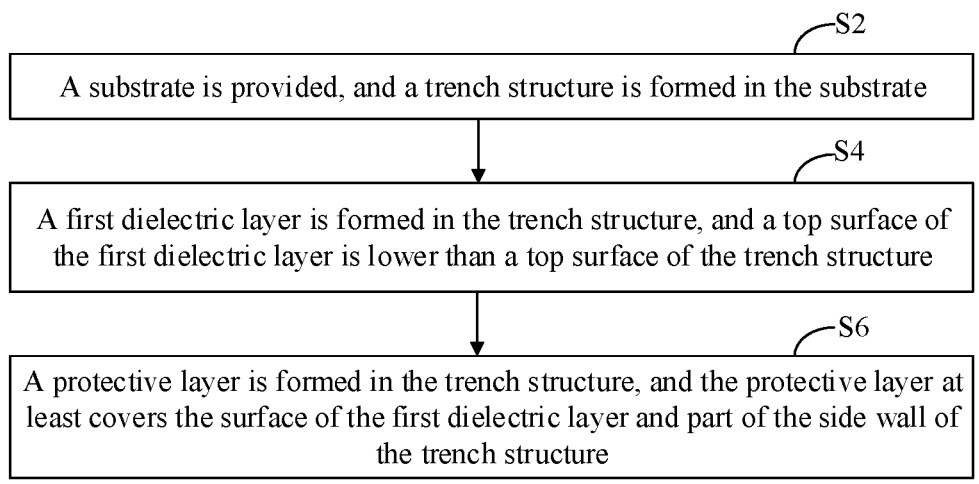
FIG. 1 is a flowchart of a manufacturing method for a semiconductor structure according to embodiments of the present disclosure.

In order to make the present disclosure convenient to understand, the present disclosure will be described more comprehensively below with reference to the related drawings. The drawings show preferred embodiments of the present disclosure. However, the present disclosure may be implemented in various forms, and is not limited to the embodiments described herein. Rather, these embodiments are provided to make the contents disclosed in the present disclosure understood more thoroughly and comprehensively.

Unless otherwise defined, all technical and scientific terms used herein have the same meanings as commonly understood by those skilled in the art that the present disclosure belongs to. Herein, terms used in the description of the present disclosure are only for the purpose of describing specific embodiments and not intended to limit the present disclosure. Term "and/or" used herein includes one or any and all combinations of multiple related items which are listed.

It is to be understood that description that an element or layer is "above", "adjacent to", "connected to", or "coupled to" another element or layer may refer to that the element or layer is directly above, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood that, although various elements, components, regions, layers and/or parts may be described with terms first, second, third, etc., these elements, components, regions, layers and/or parts should not be limited to these terms. These terms are used only to distinguish one element, component, region, layer or part from another element, component, region, layer or part. Therefore, a first element, component, region, layer or part discussed below may be represented as a second element, component, region, layer or part without departing from the teaching of the present disclosure.

Spatially relational terms such as "below", "under", "lower", "beneath", "above", and "upper" may be used herein for convenience of description to describe a relationship between one element or feature and another element or feature illustrated in the figures. It is to be understood that, in addition to the orientation shown in the figures, the spatially relational terms are intended to further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. The device may be otherwise oriented (rotated by 90 degrees or in other orientations) and the spatial descriptors used herein may be interpreted accordingly.

The terms used herein are for the purpose of describing specific embodiments only and not intended to limit the disclosure. As used herein, singular forms "a/an", "one", and "the" are also intended to include the plural forms, unless otherwise specified in the context. It is also to be understood that, when terms "composed of" and/or "including" are used in this specification, the presence of the features, integers, steps, operations, elements, and/or components is determined, but the presence or addition of one or more other features, integers, steps, operations, elements, components, and/or groups is also possible. As used herein, term "and/or" includes any and all combinations of the related listed items.

Embodiments of the present disclosure are described with reference to cross-sectional views of schematic diagrams of an ideal embodiment (and an intermediate structure) of the present disclosure. As such, changes from the shown shape caused by, for example, a manufacturing technology and/or tolerance can be expected. Therefore, the embodiments of the present disclosure should be not limited in the specific shape shown herein, instead of including the shape deviation caused by, for example, manufacturing. The areas shown in the figure are substantially schematic, and their shapes are not intended to limit the scope of the present disclosure.

With many advantages, such as good isolation effect and simple manufacturing processes, a Shallow Trench Isolation (STI) structure is especially suitable for the integrated circuit manufacturing process below sub-micrometer, and is widely applied in manufacturing insulation structures between active areas.

However, traditional STI structures generally include oxide layers to play the role of insulation protection. Therefore, in a manufacturing process for the STI structure and a process for manufacturing other semiconductor structures by using the STI structure, the adopted wet etching process or other corrosion technologies easily and excessively etch the oxide layer in the STI structure, thereby resulting in defects and affecting the performance and yield of the manufactured semiconductor device.

Referring to FIG. 1 through FIG. 3G, it is to be noted that the diagrams provided in this embodiment are only intended to illustrate the basic idea of the present disclosure. Although the diagrams only show the components relevant to the present disclosure and are not drawn according to the quantity, shapes and sizes of the components as actually implemented, the type, quantity and proportion of each component can be changed at will as actually implemented, and the component layout type may also be more complex.

Referring to FIG. 1, an embodiment of the present disclosure provides a manufacturing method for a semiconductor structure, including the following steps.

At step S2, a substrate is provided, and a trench structure is formed in the substrate.

At step S4, a first dielectric layer is formed in the trench structure, and a top surface of the first dielectric layer is lower than top surface of the trench structure.

At step S6, a protective layer is formed in the trench structure, and the protective layer at least covers the surface of the first dielectric layer and part of side wall of the trench structure.

Specifically, in the manufacturing method for the semiconductor structure provided by the abovementioned embodiments, first, the trench structure is formed in the substrate, and then the first dielectric layer is formed in the trench structure. The top surface of the first dielectric layer is set to be lower than a top surface of the trench structure, so that the protective layer at least covering the surface of the first dielectric layer and the part of side wall of the trench structure is formed in the trench structure. The protective layer covers and protects a top side wall of the trench structure, and then the excessive etching to the oxide layer in the STI structure by the adopted wet etching process or other corrosion technologies is avoided in a manufacturing process for the STI structure and a process for manufacturing other semiconductor structures by using the STI structure, thereby effectively improving the performance and yield of the manufactured semiconductor device.

Figure 2A:
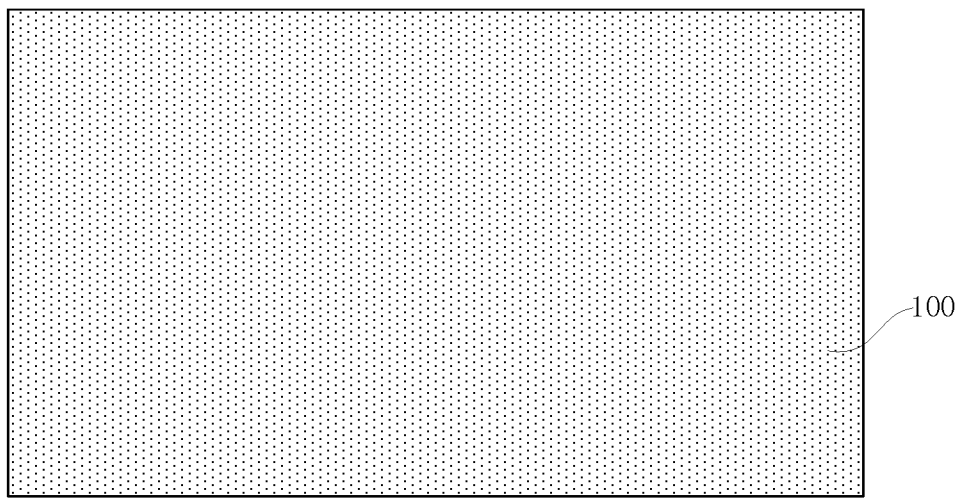
FIG. 2A is a first schematic diagram of sectional structures of the structures obtained in step S2 in a manufacturing method for a semiconductor structure according to embodiments of the present disclosure.
Figure 2B:
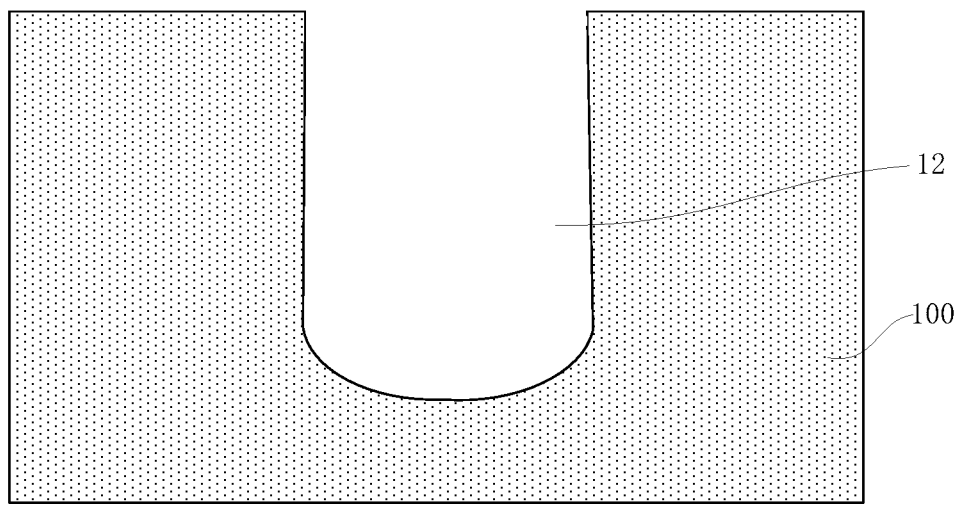
FIG. 2B is a second schematic diagram of sectional structures of the structures obtained in step S2 in a manufacturing method for a semiconductor structure according to embodiments of the present disclosure.

In step S2, referring to step S2 in FIG. 1, FIG. 2A and FIG. 2B, the substrate 100 is provided, and the trench structure 12 is formed in the substrate 100.

As an example, the substrate 100 can include, but be not limited to, a silicon substrate, a silicon germanium substrate and a Silicon-On Insulator (SOI) substrate, etc. The material of the substrate is silicon, germanium or silicon germanium. Those skilled in the art may select a substrate type according to the type of a transistor formed on the substrate. Therefore, the type of the substrate should not limit the protection scope of the present disclosure.

As an example, still referring to step S2 in FIG. 1, FIG. 2A and FIG. 2B, the operation that the trench structure 12 is formed in the substrate 100 can include the following steps.

At step S21, a graphical mask layer (not shown in the figure) is formed on the upper surface of the substrate (100), a first opening (not shown) is formed in the graphical mask layer, and the first opening defines the position and the shape of the trench structure 12.

At step S22, the upper surface of the substrate 100 is etched by adopting a dry etching process or a wet etching process based on the first graphical mask layer, so as to obtain the trench structure 12.

In this embodiment, the etching process can include a plasma dry etching process. The parameters of the adopted dry etching process include: the gas includes any one or more of fluorocarbon gas, HBr and $Cl_2$ as well as carrier gas. The fluorocarbon gas includes $CF_4$, $CHF_3$, $CH_2F_2$ or $CH_3F$, the carrier gas is inert gas, for example He, the gas flow is 50 sccm-400 sccm, and the pressure is 3-8 millitorr. As an example, the quantity of the trench structure 12 in step S22 can be multiple, the depth of each trench structure 12 can be the same or different, the width of each trench structure 12 can be the same or different, and the depth of the trench structure 12 is less than the thickness of the substrate 100.

As an example, the operation that, in step S21, the first graphical mask layer is formed on the upper surface of the substrate 100 can include the following steps.

At step S211, a first mask layer (not shown in the figure) is formed on the upper surface of the substrate 100.

At step S212, a photoetching glue layer (not shown in the figure) is coated on the surface of the first mask layer (not shown in the figure), and graphical processing is performed to form a first graphical photoetching glue layer (not shown in the figure).

At step S213, the first mask layer is etched based on the first graphical photoetching glue layer so as to form a first graphical glue layer (not shown in the figure), a first opening (not shown in the figure) is formed in the first graphical glue layer (not shown in the figure), and the first opening graphically defines the position and the shape of the trench structure 12.

At step S214, the first graphical photoetching glue layer is removed.

As an example, the formed first graphical mask layer can include a hard mask layer, the hard mask layer can be a single-layer structure or a multi-layer stacking structure, and the material of the hard mask layer can be silicon oxide. Afterwards, photoresist is coated on the hard mask layer, and the graphical photoetching glue layer is formed through a series of steps, such as exposure and developing. The graphical photoetching glue layer defines the position and the shape of the trench structure 12, the hard mask layer is etched based on the graphical photoetching glue layer so as to form the graphical mask layer, and then the graphical photoetching glue layer is removed. Certainly, in other embodiments of the present disclosure, the graphical photoetching glue layer can be reserved in a process of forming the first graphical mask layer, and then the graphical photoetching glue layer is removed after etching the substrate 100.

Figure 2C:
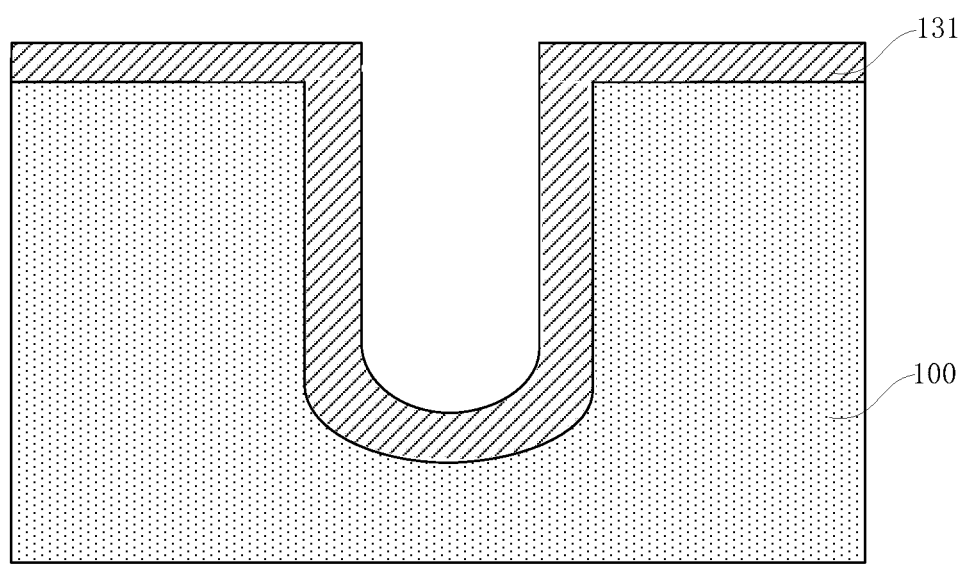
FIG. 2C is a first schematic diagram of sectional structures of the structures obtained in step S4 in a manufacturing method for a semiconductor structure according to embodiments of the present disclosure.
Figure 2D:
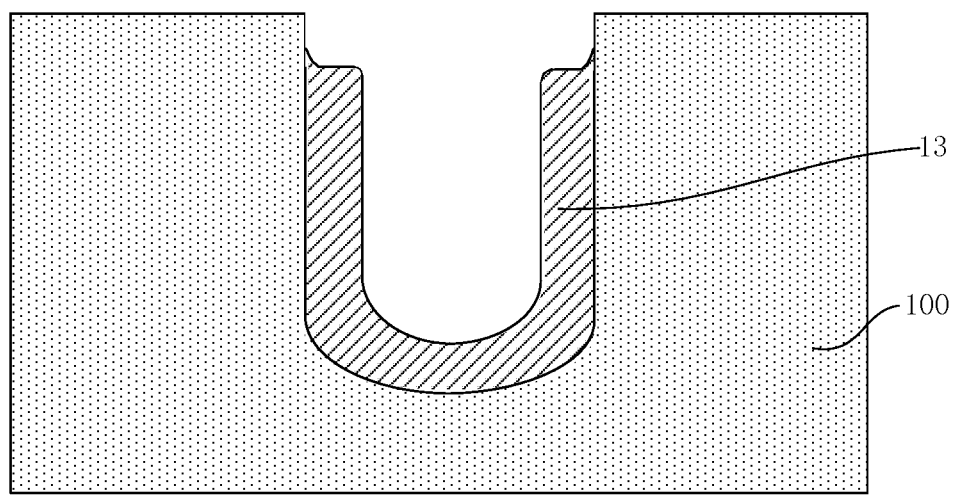
FIG. 2D is a second schematic diagram of sectional structures of the structures obtained in step S4 in a manufacturing method for a semiconductor structure according to embodiments of the present disclosure.

In step S4, referring to step S4 in FIG. 1, FIG. 2C and FIG. 2D, the operation that the first dielectric layer 13 is formed in the substrate 12 can include the following steps.

At step S42, a first dielectric material layer 131 is formed, and the first dielectric material layer 131 covers the side wall and bottom of the trench structure 12 as well as the upper surface of the substrate 100.

At step S44, the first dielectric material layer 131 on the upper surface of the substrate 100 and part of first dielectric material layer 131 in the trench part 12 are removed, and the remaining first dielectric material layer 131 forms the first dielectric layer 13.

As an example, the first dielectric layer 13 can be formed in the trench structure 12 by at least one of Atomic Layer Deposition, an in-situ moisture growth process and a rapid thermal oxidation process. The first dielectric layer 13 can include, but be not limited to, a silicon oxide layer.

As an example, the first dielectric layer 13 can be formed at the bottom and part of side wall of the trench structure 12 through the thermal oxidation process. The damage on the surface of the substrate 100 in the previous etching process can be repaired in a process of forming the first dielectric layer 13 through thermal oxidation. Moreover, the first dielectric layer 13 can also protect the surface of the substrate 100 in the subsequent manufacturing process.

As an example, still referring to FIG. 2C, the thickness of the first dielectric layer 13 formed through the thermal oxidation process can be 4.5 nm-5.5 nm. In an embodiment of the present disclosure, the thickness of the first dielectric layer 13 formed through the thermal oxidation process can be 4.5 nm, 5 nm or 5.5 nm.

As an example, still referring to FIG. 2D, in an embodiment of the present disclosure, the first dielectric material layer 131 on the upper surface of the substrate 100 and part of first dielectric material layer 131 in the trench part 12 can be removed by adopting the etching process, and the first dielectric material layer 131 in the trench structure 12 is reserved to form the first dielectric layer 13. The height that the top of the first dielectric layer 13 is lower than the top of the trench structure 12 can be 1 nm-50 nm. As an example, the height that the top of the first dielectric layer 13 is lower than the top of the trench structure 12 can be 1 nm, 10 nm, 20 nm, 30 nm, 40 nm or 50 nm.

Figure 2E:
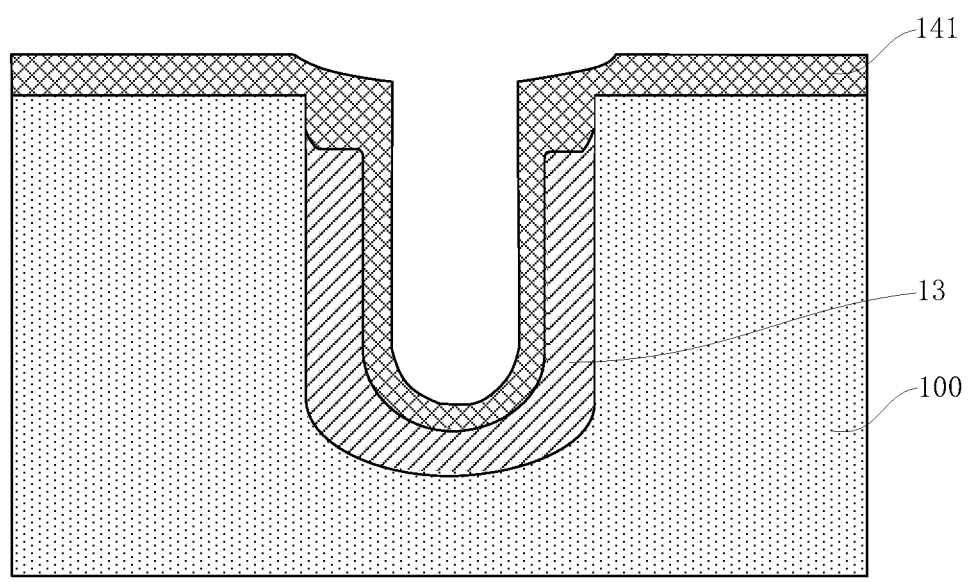
FIG. 2E is a first schematic diagram of sectional structures of the structures obtained in step S6 in a manufacturing method for a semiconductor structure according to embodiments of the present disclosure.
Figure 2F:
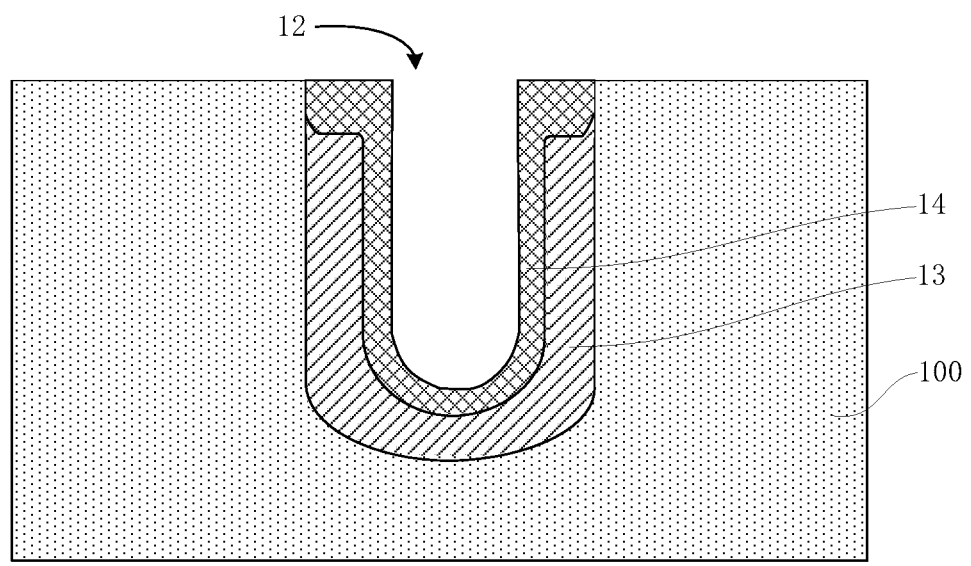
FIG. 2F is a second schematic diagram of sectional structures of the structures obtained in step S6 in a manufacturing method for a semiconductor structure according to embodiments of the present disclosure.

In step S6, referring step S6 in FIG. 1, FIG. 2E and FIG. 2F, the protective layer 14 is formed in the trench structure 12, and the protective layer 14 at least covers the surface of the first dielectric layer 13 and part of side wall of the trench structure 12.

As an example, still referring to step S6 in FIG. 1, FIG. 2E and FIG. 2F, the operation, in step S6, that the protective layer 14 is formed in the trench structure 12 can include the following steps.

At step S62, a protective material layer 141 is formed, and the protective material layer 141 covers the side wall and bottom of the trench structure 12 as well as the upper surface of the substrate 100.

At step S64, the protective material layer 141 on the surface of the substrate 100 is removed, and the remaining protective material layer 141 forms the protective layer 14.

As an example, still referring to FIG. 2E and FIG. 2F, in an embodiment of the present disclosure, the formation process for the protective layer 14 can be one or more of Chemical Vapor Deposition (CVD), Atomic Layer Deposition (ALD), High Density Plasma (HDP) and a plasma enhancing deposition process. In the present disclosure, ALD is preferably adopted to form the protective layer 14 on the surface of the first dielectric layer 13. The protective layer 14 includes, but is not limited to, a silicon nitride layer.

As an example, in an embodiment of the present disclosure, the thickness of the protective layer 14 formed through the deposition process in step S6 can be 9.5 nm-10.5 nm, for example, the thickness of the protective layer 14 can be 9.5 nm, 10.0 nm or 10.5 nm.

Figure 2G:
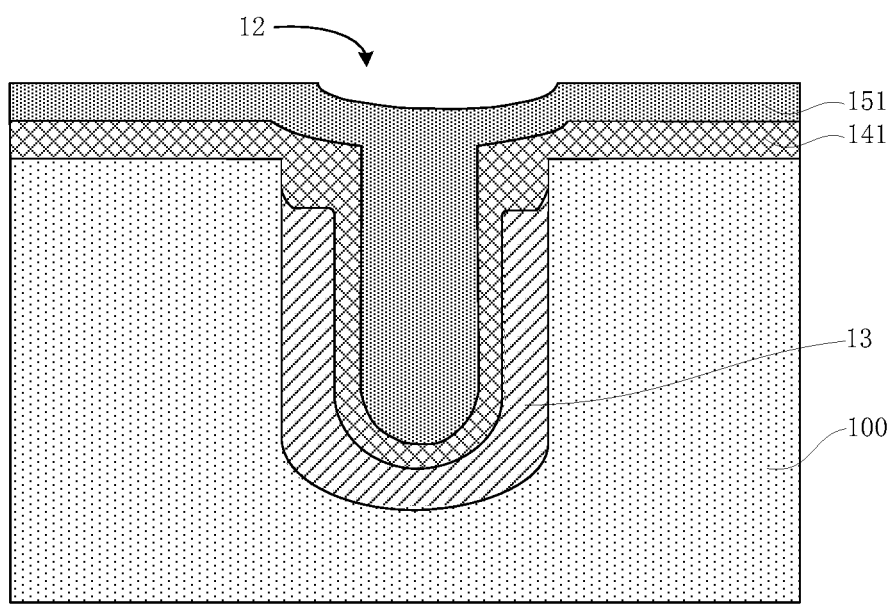
FIG. 2G is a third schematic diagram of sectional structures of the structures obtained in step S6 in a manufacturing method for a semiconductor structure according to embodiments of the present disclosure.
Figure 2H:
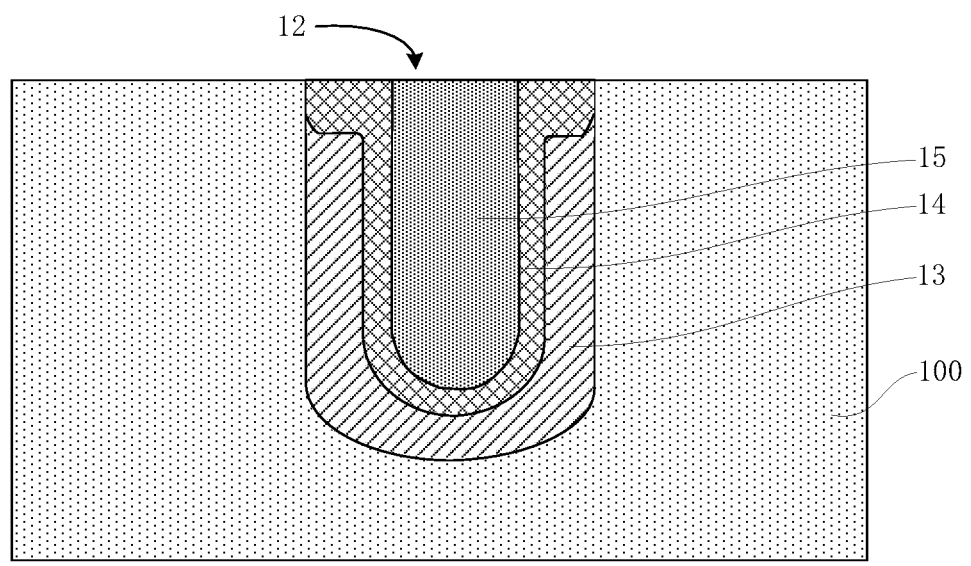
FIG. 2H is a fourth schematic diagram of sectional structures of the structures obtained in step S6 in a manufacturing method for a semiconductor structure according to embodiments of the present disclosure.

As an example, referring to FIG. 2G and FIG. 2H, in an embodiment of the present disclosure, after forming the protective material layer 141 in step S62, further including the following steps.

At step S631, a second dielectric material layer 151 is formed, and the second dielectric material layer 151 fills completely the trench structure 12 and covers the surface of the protective material layer 141.

At step S632, the protective material layer 141 and the second dielectric material layer 151 located on the surface of the substrate 100 as well as the protective material layer 141 and the second dielectric material layer 151 located on the trench structure 12 are removed, the protective material layer 141 in the trench structure 12 is reserved to form the protective layer 14, and the second dielectric material layer 151 in the trench structure 12 is reserved to form the second dielectric layer 15.

As an example, in step S631, the second dielectric material layer 151 can be deposited in the trench structure 12 by adopting Low Pressure Chemical Vapor Deposition (LPCVD), and the second dielectric material layer 151 fills completely the trench structure 12 and covers the surface of the protective material layer 141.

As an example, still referring to FIG. 2H, in an embodiment of the present disclosure, in step S632, a chemical mechanical polishing process can be adopted to flatten the upper surface of the substrate 100, so as to optimize the working performance and reliability of the device. The upper surface of the substrate 100 can be set in order to perform the chemical mechanical polishing process for a stopping layer, and then the protective material layer 141 and the second dielectric material layer 151 that are located on the surface of the substrate 100 and the trench structure 12 are removed, the protective material layer 14 in the trench structure 12 is reserved to form the protective layer 14, and the second dielectric material layer 151 in the trench structure 12 is reserved to form the second dielectric layer 15, so that the upper surface of the substrate 100 is flattened.

Preferably, in an embodiment of the present disclosure, prior to forming the protective layer 14 by adopting the deposition process, the first dielectric layer 13 is subjected to steam annealing so as to relief stress, and the first dielectric layer 13 is densified so as to repair a gap in the trench structure.

Figure 3A:
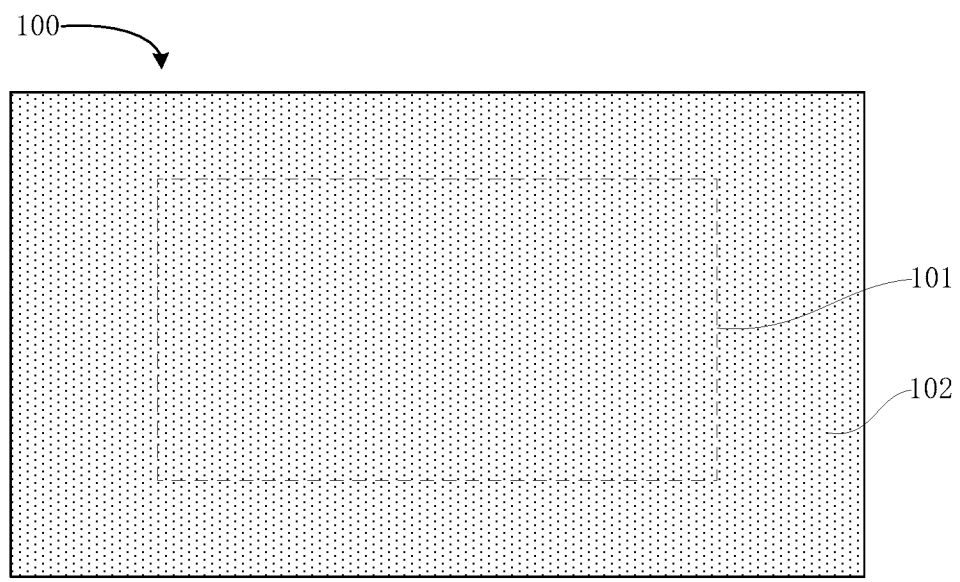
FIG. 3A is a first schematic diagram of sectional structures of the structures obtained in step S2 in a manufacturing method for a semiconductor structure according to embodiments of the present disclosure.
Figure 3B:
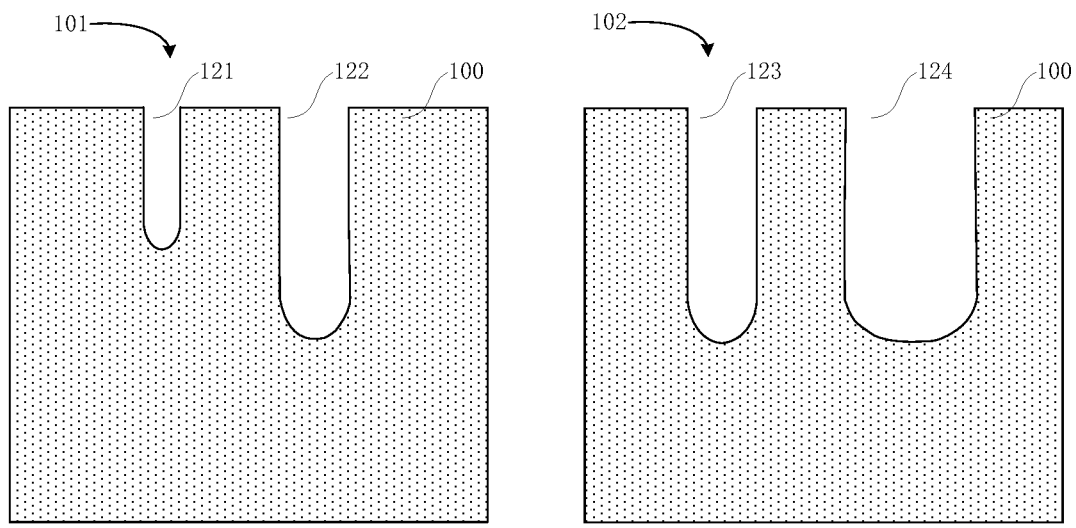
FIG. 3B is a second schematic diagram of sectional structures of the structures obtained in step S2 in a manufacturing method for a semiconductor structure according to embodiments of the present disclosure.

As an example, referring to step S2 in FIG. 1, FIG. 3A and FIG. 3B, the substrate 100 provided in step S2 includes an array area 101 and a peripheral area 102 located at the periphery of the array area 101, the trench structure formed in the substrate 100 includes a first trench structure 121, a second trench structure 122, a third trench structure 123 and a fourth trench structure 124, the first trench structure 121 and the second trench structure 122 are located in the array area 101, and the third trench structure 123 and the fourth trench structure 124 are located in the peripheral area 102.

As an example, still referring to step S2 in FIG. 1, FIG. 3A and FIG. 3B, the width of the first trench structure 121 is less than the width of the second trench structure 122, the depth of the first trench structure 121 is less than the depth of the second trench structure 122, the width of the third trench structure 123 is less than the width of the fourth trench structure 124, and the depth of the third trench structure 123 and the depth of the fourth trench structure 124 are both identical to the width of the second trench structure 122.

Figure 3C:
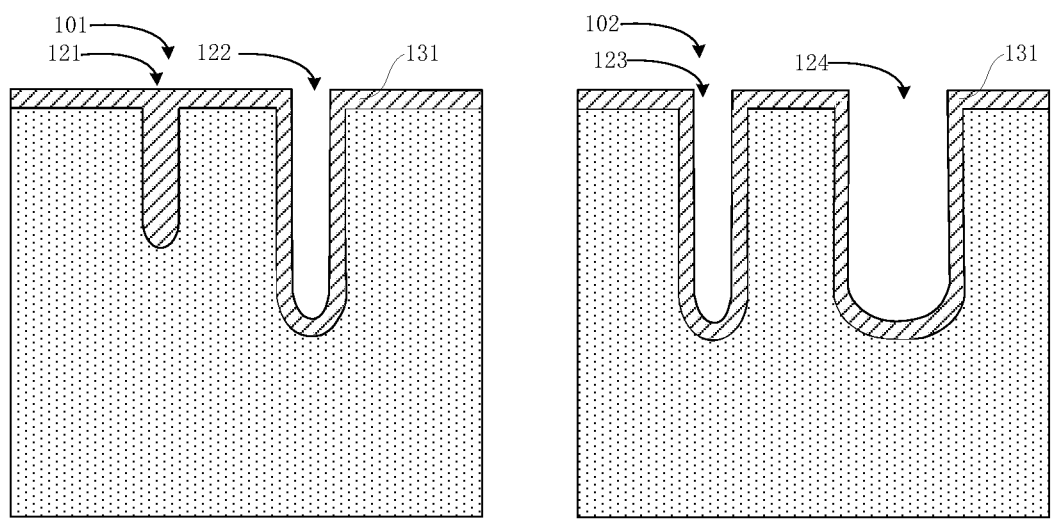
FIG. 3C is a first schematic diagram of sectional structures of the structures obtained in step S4 in a manufacturing method for a semiconductor structure according to embodiments of the present disclosure.

As an example, still referring to step S4 in FIG. 1, FIG. 3C and FIG. 3, the step of forming the first dielectric layer 13 in the substrate 12 includes the following steps.

At step S421, the first dielectric material layer 131 is formed in the first trench structure 121, the second trench structure 122, the third trench structure 123 and the fourth trench structure 124 as well as on the surface of the substrate 100. The first dielectric material layer 131 fills completely the first trench structure 121 and covers the side walls and bottoms of the second trench structure 122, the third trench structure 123 and the fourth trench structure 124.

At step S441, the first dielectric material layer on the surface of the substrate is removed, and part of first dielectric material layer in the trench structure is removed so as to form the first dielectric layer.

As an example, in step S421, the first dielectric layer 131 can be formed in the first trench structure 121, the second trench structure 122, the third trench structure 123 and the fourth trench structure 124 as well as on the surface of the substrate 100 by at least one of an ALD, an in-situ moisture growth process, or a rapid thermal oxidation process. The first dielectric material layer 131 can include, but not limited to, a silicon oxide layer.

As an example, in step S441, the first dielectric material 131 on the upper surface of the substrate 100, as well as part of first dielectric material layer 131 in the first trench structure 121, the second trench structure 122, the third trench structure 123 and the fourth trench structure 124 can be removed by adopting the etching process, and the remaining first dielectric material layer 131 forms the first dielectric layer 13. The top of the first dielectric layer 13 in the first trench structure 121 is lower than the top of the first trench structure 121, the top of the first dielectric layer 13 in the second trench structure 122 is lower than the top of the second trench structure 122, the top of the first dielectric layer 13 in the third trench structure 123 is lower than the top of the third trench structure 123, and the top of the first dielectric layer 13 in the fourth trench structure 124 is lower than the top of the fourth trench structure 124.

Figure 3D:
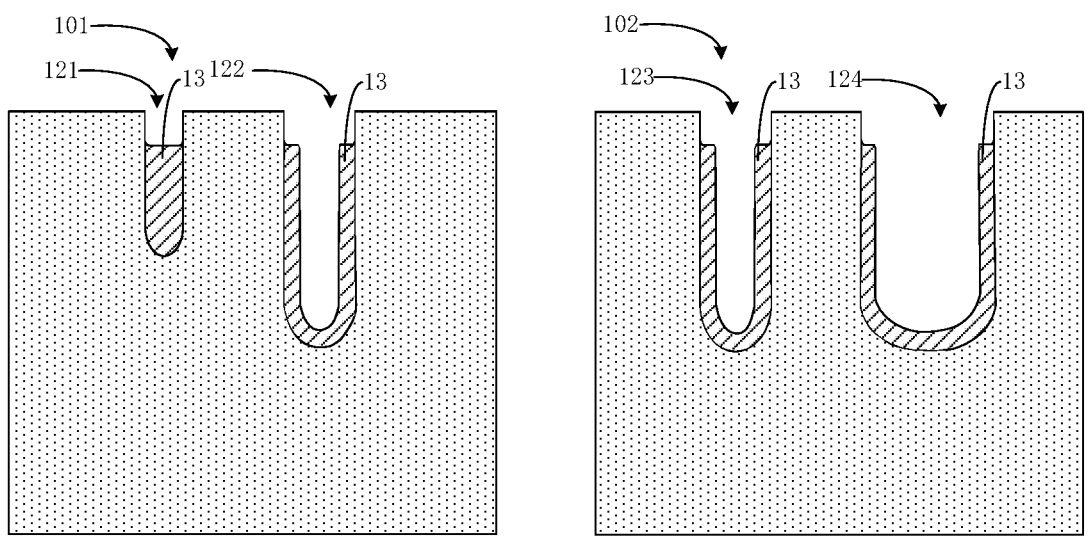
FIG. 3D is a second schematic diagram of sectional structures of the structures obtained in step S4 in a manufacturing method for a semiconductor structure according to embodiments of the present disclosure.

As an example, still referring to FIG. 3D, the height that the top of the first dielectric layer 13 in the first trench structure 121 is lower than the top of the first trench structure 121 is 1 nm-50 nm, the height that the top of the first dielectric layer 13 in the second trench structure 122 is lower than the top of the second trench structure 122 is 1 nm-50 nm, the height that the top of the first dielectric layer 13 in the third trench structure 123 is lower than the top of the third trench structure 123 is 1 nm-50 nm, and the height that the top of the first dielectric layer 13 in the fourth trench structure 124 is lower than the top of the fourth trench structure 124 is 1 nm-50 nm. Taking the first trench structure 121 an example, the height that the top of the first dielectric layer 13 in the first trench structure 121 is lower than the top of the first trench structure 121 can be 1 nm, 10 nm, 20 nm, 30 nm, 40 nm or 50 nm.

In step S6, referring to step S6 in FIG. 1, FIG. 3E, FIG. 3F and FIG. 3G, the operation that, in step S6, the protective layer 14 is formed in the trench structure can include the following steps.

At step S621, the protective material layer 141 is formed in the first trench structure 121, the second trench structure 122, the third trench structure 123 and the fourth trench structure 124 as well as on the surface of the substrate 100, and the protective material layer 141 fills completely the first trench structure 121, the second trench structure 122 and the third trench structure 123, and covers the surface of the first dielectric layer 13 located in the fourth trench structure 124.

Figure 3E:
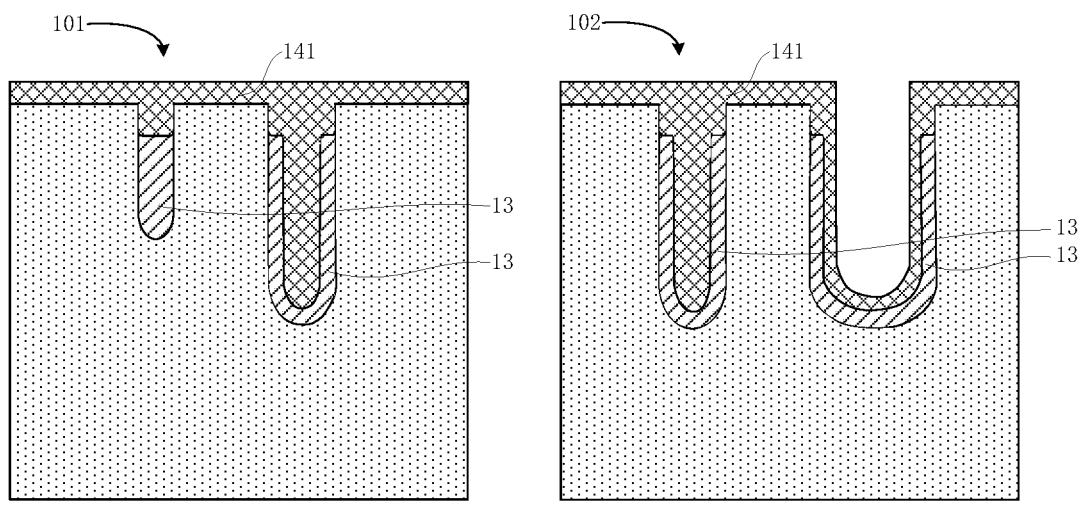
FIG. 3E is a first schematic diagram of sectional structures of the structures obtained in step S6 in a manufacturing method for a semiconductor structure according to embodiments of the present disclosure.
Figure 3F:
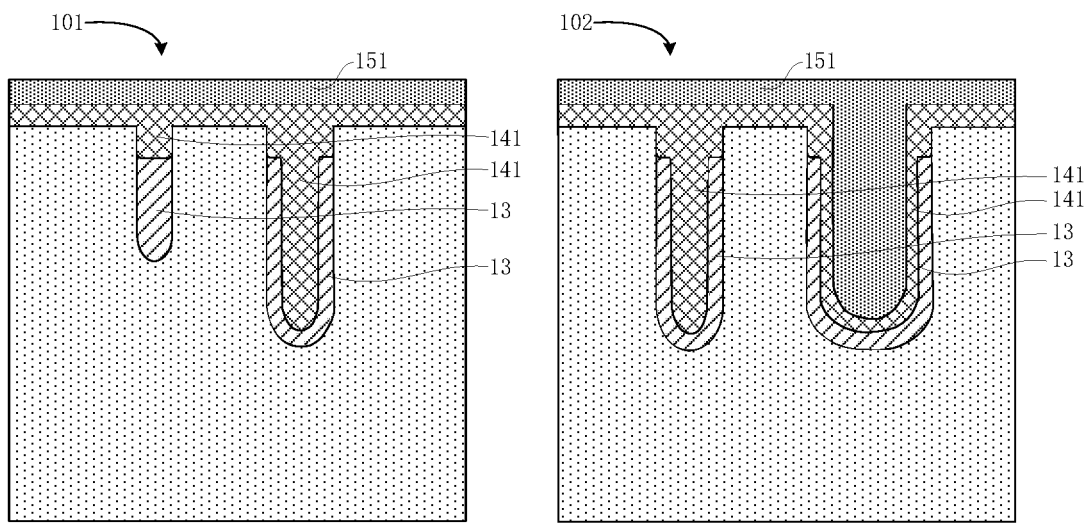
FIG. 3F is a second schematic diagram of sectional structures of the structures obtained in step S6 in a manufacturing method for a semiconductor structure according to embodiments of the present disclosure.

In step S6, referring to step S6 in FIG. 1, FIG. 3E and FIG. 3F, after forming the protective material layer, further including the following operations.

At step S63, the second dielectric material layer 151 is formed on the surface of the protective material layer 141, and the second dielectric material layer 151 covers the surface of the protective material layer 141, and fills completely the fourth trench structure 124.

At step S641, the protective material layer 141 located on the surface of the substrate 100 and the second dielectric material layer 151 located on the surface of the substrate 100 are removed, the remaining protective material layer 141 forms the protective layer, and the remaining second dielectric material layer 151 forms the second dielectric layer 15.

Figure 3G:
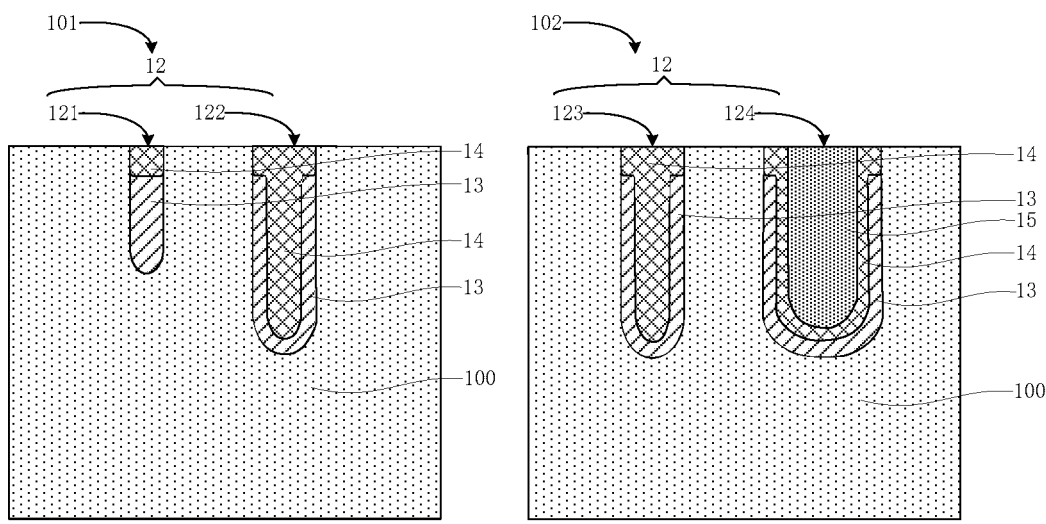
FIG. 3G is a third schematic diagram of sectional structures of the structures obtained in step S6 in a manufacturing method for a semiconductor structure according to embodiments of the present disclosure.

As an example, still referring to FIG. 3E, FIG. 3F and FIG. 3G, the protective material layer 141 can be deposited in the trench structure 12 through ALD, the protective material layer 141 fills completely the first trench structure 121, the second trench structure 122 and the third trench structure 123, and covers the surface of the first dielectric layer 13 located in the fourth trench structure 124.

As an example, still referring to FIG. 3E, FIG. 3F and FIG. 3G, the second dielectric material layer 151 is formed on the surface of the protective material layer 141 through the HDP, the second dielectric material layer 151 covers the surface of the protective material layer 141 and fills completely the fourth trench structure 124. Afterwards, the protective material layer 141 located on the surface of the substrate 100 and the second dielectric material layer 151 located on the surface of the substrate 100 are removed through the chemical mechanical polishing process, the remaining protective material layer 141 forms the protective layer 14, and the remaining second dielectric material layer 151 forms the second dielectric layer 15. The upper surface of the substrate 100 is flattened through the chemical mechanical polishing process.

In some embodiments, the present disclosure further provides a semiconductor structure, which may be manufactured through the manufacturing method in any embodiment of the present disclosure. Referring to FIG. 2F, the semiconductor structure includes a substrate 100, a trench structure 12, a first dielectric layer 13 and a protective layer 14. The trench structure 12 is located in the substrate 100, the first dielectric layer 13 covers the bottom and part of side wall of the trench structure 12, and the top surface of the first dielectric layer 13 is lower than the top surface of the trench structure 12. The protective layer 14 is located in the trench structure 12 and at least covers the surface of the first dielectric layer 13 and part of side wall of the trench structure 12.

Specifically, still referring to FIG. 2F, in the semiconductor structure provided by the abovementioned embodiments, the top surface of the first dielectric layer 13 in the trench structure 12 is set to be lower than top surface of the trench structure 12, and the protective layer 14 at least covering the surface of the first dielectric layer 13 and the part of side wall of the trench structure 12 is formed in the trench structure 12, so that the protective layer 14 covers and protects a top side wall of the trench structure 12. The excessive etching to the oxide layer in the STI structure by the adopted wet etching process or other corrosion technologies is avoided in a manufacturing process for the STI structure and a process for manufacturing other semiconductor structures by using the STI structure, thereby effectively improving the performance and yield of the manufactured semiconductor device.

As an example, referring to FIG. 2G, in an embodiment of the present disclosure, the semiconductor structure further includes a second dielectric layer 15, and the second dielectric layer fills the trench structure 12 without a gap. In a case that the width of the trench is smaller and the first dielectric layer 13 fills the trench structure 12 without the gap, the trench structure 12 is filled completely by using the second dielectric layer 15, to facilitate the upper surface of the substrate 100 being subject to subsequent flattening processing.

As an example, referring to FIG. 3A and FIG. 3G, in an embodiment of the present disclosure, the substrate 100 includes an array area 101 and a peripheral area 102 located at the periphery of the array area 101, the trench structure 12 includes a first trench structure 121, a second trench structure 122, a third trench structure 123 and a fourth trench structure 124, the first trench structure 121 and the second trench structure 122 are located in the array area 101, and the third trench structure 123 and the fourth trench structure 124 are located in the peripheral area 102.

As an example, still referring to FIG. 3G, in an embodiment of the present disclosure, the width of the first trench structure 121 is less than the width of the second trench structure 122, the depth of the first trench structure 121 is less than the depth of the second trench structure 122, the width of the third trench structure 123 is less than the width of the fourth trench structure 124, and the depth of the third trench structure 123 and the depth of the fourth trench structure 124 are both identical to the depth of the second trench structure 122.

As an example, still referring to FIG. 3G, in an embodiment of the present disclosure, the first dielectric layer 13 fills the first trench structure 121 without the gap, and covers the bottoms and part of side walls of the second trench structure 122, the third trench structure 123 and the fourth trench structure 124. The top of the first dielectric layer 13 in the first trench structure 121 is lower than the top of the first trench structure 121, the top of the first dielectric layer 13 in the second trench structure 122 is lower than the top of the second trench structure 122, the top of the first dielectric layer 13 in the third trench structure 123 is lower than the top of the third trench structure 123, and the top of the first dielectric layer 13 in the fourth trench structure 124 is lower than the top of the fourth trench structure 124.

As an example, still referring to FIG. 3G, the height that the top of the first dielectric layer 13 in the first trench structure 121 is lower than the top of the first trench structure 121 is 1 nm-50 nm, the height that the top of the first dielectric layer 13 in the second trench structure 122 is lower than the top of the second trench structure 122 is 1 nm-50 nm, the height that the top of the first dielectric layer 13 in the third trench structure 123 is lower than the top of the third trench structure 123 is 1 nm-50 nm, and the height that the top of the first dielectric layer 13 in the fourth trench structure 124 is lower than the top of the fourth trench structure 124 is 1 nm-50 nm. Taking the first trench structure 121 as an example, the height that the top of the first dielectric layer 13 in the first trench structure 121 is lower than the top of the first trench structure 121 can be 1 nm, 10 nm, 20 nm, 30 nm, 40 nm or 50 nm.

As an example, still referring to FIG. 3G, in an embodiment of the present disclosure, the protective layer 14 fills completely the first trench structure 121, the second trench structure 122 and the third trench structure 123, and covers the surface of the first dielectric layer 13 in the fourth trench structure 124 and part of side wall of the fourth trench structure 124.

As an example, still referring to FIG. 3G, in an embodiment of the present disclosure, the first dielectric layer 13 can be formed in the first trench structure 121, the second trench structure 122, the third trench structure 123 and the fourth trench structure 124 by at least one of ALD, the in-situ moisture growth process and the rapid thermal oxidation process. The first dielectric layer 13 can include, but be not limited to, the silicon oxide layer.

As an example, still referring to FIG. 3G, in an embodiment of the present disclosure, the ALD is adopted to form the protective layer 14 on the surface of the first dielectric layer 13. The protective layer 14 can include, but be not limited to, the silicon nitride layer.

As an example, still referring to FIG. 3F, in an embodiment of the present disclosure, the second dielectric material layer 151 can be formed on the surface of the protective material layer 141 by adopting the deposition process after forming the protective material layer 141, and the second dielectric material layer 151 covers the surface of the protective material layer 141, and fills completely the fourth trench structure 124. For example, after forming the protective material layer 141, the second dielectric material layer 151 is formed on the surface of the protective material layer 141 through the LPCVD. The formed second dielectric material layer 151 covers the surface of the protective material layer 141 and fills completely the fourth trench structure 124.

As an example, still referring to FIG. 3F, in an embodiment of the present disclosure, the second dielectric material layer 15 includes, but is not limited to, the silicon oxide layer.

As an example, still referring to FIG. 3G, after forming the second dielectric material layer 151, the surface of substrate 100 can be subjected to flattening processing through the chemical mechanical polishing process, so as to remove the protective material layer 141 and the second dielectric material layer 151 on the surface of the substrate 100, the first trench structure 121, the second trench structure 122, the third trench structure 123 and the fourth trench structure 124. The protective material layer 141 in the first trench structure 121, the second trench structure 122, the third trench structure 123 and the fourth trench structure 124 is reserved to form the protective layer 14, and the second dielectric material layer 151 in the fourth trench structure 124 is reserved to form the second dielectric layer 15, so that the upper surface of the substrate 100 is flattened.

According to the manufacturing method for the semiconductor structure and the semiconductor structure provided by the abovementioned embodiments, the top surface of the first dielectric layer located in the trench structure in the substrate is set to be lower than the top surface of the trench structure, so that the protective layer at least covering the surface of the first dielectric layer and the part of side wall of the trench structure is formed in the trench structure. The protective layer covers and protects the top side wall of the trench structure, and then the excessive etching to the oxide layer in the STI structure by the adopted wet etching process or other corrosion technologies is avoided in a manufacturing process for the STI structure and a process for manufacturing other semiconductor structures by using the STI structure, thereby effectively improving the performance and yield of the manufactured semiconductor device.

It should be noted that the above embodiments are for illustrative purposes only and do not intend to limit the present disclosure.

It should be understood that, unless otherwise specified herein, the implementation of those steps is not strictly limited by the order, and those steps may be implemented in other orders. Moreover, at least part of steps of the abovementioned steps may include a plurality of sub-steps or a plurality of stages, these sub-steps or stages are not necessarily implemented or completed at the same time, and may be implemented at different times. The implementation order of these sub-steps or stages are not necessarily performed successively, but implemented in turns or alternately with other steps or the sub-steps or stages of other steps.

Various embodiments in the specification are described in a progressive manner, each embodiment focuses on the difference from other embodiments, and the same and similar parts of various embodiments can be referred to each other.

Each technical feature of the abovementioned embodiments may be combined freely. For simplicity of description, not all possible combinations of each technical solution in the abovementioned embodiments are described. However, any combination of these technical features shall fall within the scope recorded in the specification without conflicting.

The abovementioned embodiments only express some implementation modes of the present disclosure and are specifically described in detail and not thus understood as limits to the patent scope of the disclosure. It is to be pointed out that those of ordinary skill in the art may further make a plurality of transformations and improvements without departing from the concept of the present disclosure and all of these falls within the scope of protection of the disclosure. Therefore, the scope of patent protection of the present disclosure should be subject to the appended claims.

What is claimed is:

1. A manufacturing method for a semiconductor structure, comprising:
    providing a substrate, and forming a trench structure in the substrate;
    forming a first dielectric layer in the trench structure, a top surface of the first dielectric layer being lower than a top surface of the trench structure; and
    forming a protective layer in the trench structure, and the protective layer at least covering a surface of the first dielectric layer and part of a side wall of the trench structure,
    wherein the substrate comprises an array area, and a peripheral area located at a periphery of the array area; the trench structure comprises a first trench structure, a second trench structure, a third trench structure, and a fourth trench structure; the first trench structure and the second trench structure are both located in the array area; and the third trench structure and the fourth trench structure are both located in the peripheral area;
    wherein said forming the first dielectric in the trench structure comprises:
        forming a first dielectric material layer in the first trench structure, the second trench structure, the third trench structure, and the fourth trench structure as well as on a surface of the substrate, the first dielectric material layer filling completely the first trench structure and covering the bottoms and side walls of the second trench structure, the third trench structure and the fourth trench structure; and removing the first dielectric material layer located on the surface of the substrate, and removing part of first dielectric material layer located in the trench structure so as to form the first dielectric layer, wherein said forming the protective later in the trench structure comprises:

forming the protective material layer in the first trench structure, the second trench structure, the third trench structure and the fourth trench structure as well as on the surface of the substrate, and the protective material layer filling completely the first trench structure, the second trench structure and the third trench structure, and covering the surface of the first dielectric layer in the fourth trench structure.

2. The method of claim 1, wherein a width of the first trench structure is less than a width of the second trench structure, and a depth of the first trench structure is less than a depth of the second trench structure; and a width of the third trench structure is less than a width of the fourth trench structure, and a depth of the third trench structure and the depth of the fourth trench structure are both identical to the depth of the second trench structure.

3. The method of claim 1, wherein after forming the protective material layer, the method further comprises:

forming a second dielectric material layer on a surface of the protective material layer, the second dielectric material layer covering the surface of the protective material layer, and filling completely the fourth trench structure; and removing the protective material layer located on the surface of the substrate and the second dielectric material layer located on the surface of the substrate, remaining protective material layer forming the protective layer, and remaining second dielectric material layer forming the second dielectric layer.

4. The method of claim 1, wherein a silicon oxide layer formed in the trench structure with at least one of an Atomic Layer Deposition (ALD), an in-situ moisture growth process, or a rapid thermal oxidation process is used as the first dielectric layer.

5. The method of claim 1, wherein a silicon nitride layer formed in the trench structure is used as the protective layer.

6. A semiconductor structure, comprising:

a substrate;

a trench structure, the trench structure being located in the substrate;

a first dielectric layer, the first dielectric layer covering a bottom and part of a side wall of the trench structure, and a top surface of the first dielectric layer being lower than a top surface of the trench structure; and a protective layer, the protective layer being located in the trench structure, and at least covering a surface of the first dielectric layer and part of the side wall of the trench structure, wherein the substrate comprises an array area, and a peripheral area located at a periphery of the array area; the trench structure comprises a first trench structure, a second trench structure, a third trench structure, and a fourth trench structure; the first trench structure and the second trench structure are both located in the array area; and the third trench structure and the fourth trench structure are both located in the peripheral area;

wherein the first dielectric layer fills the first trench structure without a gap, and cover the bottoms and part of ide walls of the second trench structure, the third trench structure and the fourth trench structure; a top of the first dielectric layer in the first trench structure is lower than a top of the first trench structure; a top of the first dielectric layer in the second trench structure is lower than a top of the second trench structure; a top of the first dielectric layer in the third trench structure is lower than a top of the third trench structure; and a top of the first dielectric layer in the fourth trench structure is lower than a top of the fourth trench structure;

wherein the protective layer fills completely the first trench structure, the second trench structure, and the third trench structure, and covers a surface of the first dielectric layer in the fourth trench structure and part of a side wall of the fourth trench structure.

7. The semiconductor structure of claim 6, wherein a width of the first trench structure is less than a width of the second trench structure, and a depth of the first trench structure is less than a depth of the second trench structure; and a width of the third trench structure is less than a width of the fourth trench structure, and a depth of the third trench structure and a depth of the fourth trench structure are both identical to the depth of the second trench structure.

8. The semiconductor structure of claim 6, wherein the semiconductor structure further comprises a second dielectric layer, the second dielectric layer filling completely the fourth trench structure.

9. The semiconductor structure of claim 6, wherein the first dielectric layer comprises silicon dioxide.

10. The semiconductor structure of claim 6, wherein the protective layer comprises silicon nitride.

* * * * *